United States Patent
Mayama et al.

(10) Patent No.: US 7,031,129 B2
(45) Date of Patent: Apr. 18, 2006

(54) PROTECTION CIRCUIT

(75) Inventors: Shuji Mayama, Mie (JP); Isao Isshiki, Mie (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/777,156

(22) Filed: Feb. 13, 2004

(65) Prior Publication Data

US 2004/0228059 A1    Nov. 18, 2004

(30) Foreign Application Priority Data

Feb. 14, 2003    (JP) ............................ P2003-036909

(51) Int. Cl.
*H02H 3/20*    (2006.01)
*H02H 9/00*    (2006.01)

(52) U.S. Cl. ................................... 361/91.1

(58) Field of Classification Search ............... 361/91.1, 361/111, 91.5
See application file for complete search history.

(56) References Cited

U.S. PATENT DOCUMENTS

| | | | | |
|---|---|---|---|---|
| 4,808,839 A | * | 2/1989 | Dunn et al. | 327/546 |
| 4,914,540 A | * | 4/1990 | Tabata et al. | 361/91.7 |
| 5,500,616 A | * | 3/1996 | Ochi | 327/310 |
| 5,737,169 A | * | 4/1998 | Sellers | 361/98 |
| 5,764,035 A | * | 6/1998 | Lee | 320/160 |
| 5,828,244 A | * | 10/1998 | Palara et al. | 327/108 |
| 5,854,542 A | * | 12/1998 | Forbes | 315/291 |
| 5,886,563 A | * | 3/1999 | Nasila | 327/423 |
| 6,005,761 A | * | 12/1999 | Izawa et al. | 361/103 |
| 6,346,778 B1 | * | 2/2002 | Mason et al. | 315/291 |
| 6,362,943 B1 | * | 3/2002 | Galecki et al. | 361/93.9 |
| 6,392,463 B1 | * | 5/2002 | Kitagawa et al. | 327/309 |

* cited by examiner

*Primary Examiner*—Brian Sircus
*Assistant Examiner*—Z Kitov
(74) *Attorney, Agent, or Firm*—Oliff & Berridge, PLC

(57) ABSTRACT

A protection circuit, to be provided for a circuit arrangement having an inductive load and an FET as an N-channel MOS transistor provided upstream of the load with respect to a flow of power current, the FET controlling an energization state of the load, the protection circuit includes a first connection changer interposed on a connection line between a gate of the FET and a gate drive voltage supply source, the first connection changer changing a connection state between a first connection state in which the gate is connected to the gate drive voltage supply and a second connection state in which the gate is connected to a ground.

10 Claims, 4 Drawing Sheets

RELATED ART   FIG. 6
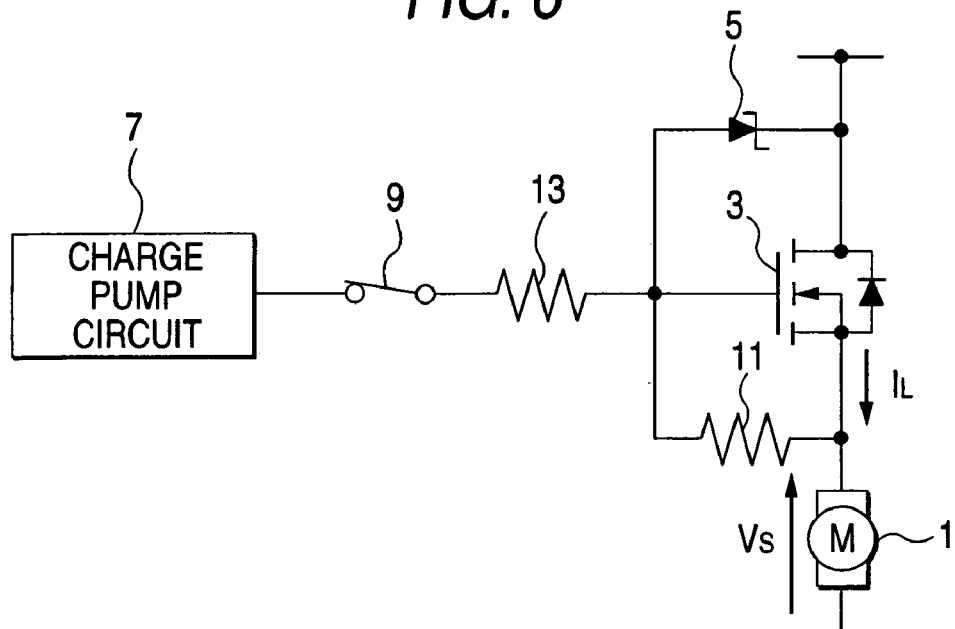
RELATED ART   FIG. 7
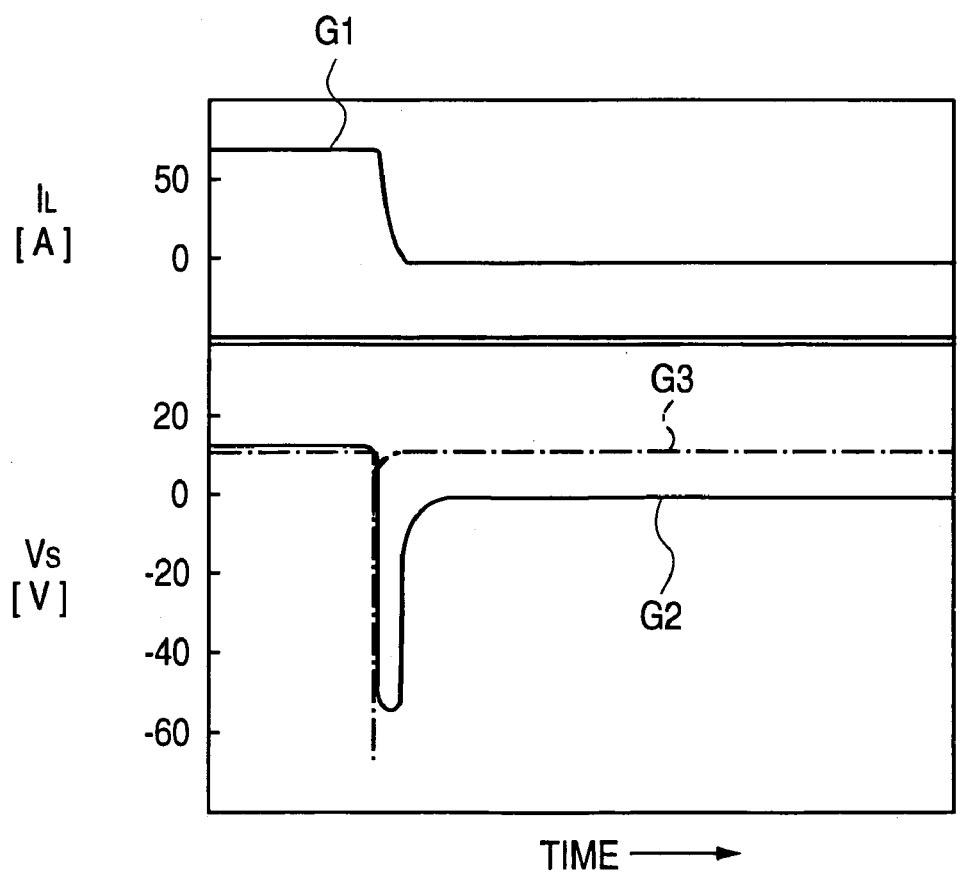

PROTECTION CIRCUIT

BACKGROUND OF THE INVENTION

1. Field of the Invention

The present invention relates to a protection circuit for protecting the FET or the like for control of the energization state of current to the inductive load, and more particularly to a protection circuit to be applied for power source control of the vehicle-mounted power distributor section in various kinds.

2. Background Art

FIG. 6 is a circuit diagram of the conventional protection circuit and circuit arrangement the protection circuit is applied. The protection circuit of this kind, as shown in FIG. 6, has a Zener diode 5 interposed between the gate and the drain of an FET 3 as an N-channel MOS transistor, a switch 9 interposed on a connection line between the gate and a charge pump circuit 7 as a gate-drive voltage supply source thereof, a first resistor 11 interposed between the gate and the source of the FET 3 and a second resistor 13 interposed between the gate of the FET 3 and the switch 9, as a countermeasure to the surge voltage caused upon powering off the inductive load (e.g. motor) 1.

The switch 9 serves also as an on-off switch for the FET 3. During driving the load 1, the switch 9 connects between the FET 3 gate and the charge pump circuit 7 thereby turning on the FET 3. Meanwhile, when the load 1 is powered off, the switch 9 disconnects between the gate and the charge pump circuit 7 thereby turning off the FET 3. Consequently, during driving the load 1, the drive voltage outputted from the charge pump circuit 7 is supplied to the gate of the FET 3 through the switch 9 and resistor 13. This turns on the FET 3, thereby energizing the load 1 and driving the load 1. During powering off the load 1, the switch 9 disconnects between the FET 3 gate and the charge pump circuit 7. This turns off the FET 3 at a time the gate voltage goes below a threshold voltage. Due to turning off the FET 3, a negative surge is caused on the source potential of the FET 3 by an inductive counter electromotive force on the load 1. The negative surge pulls the gate potential toward the minus through the resistor 1. When the gate-to-drain voltage difference of the FET 3 exceeds the threshold voltage of the Zener diode 5, the FET 3 is brought into conduction between the gate and the drain through the Zener diode 5. A current flows from the drain to the source through the Zener diode 5 and resistor 11. When the gate-to-source voltage difference caused thereupon exceeds the threshold voltage, the FET 3 is turned on. The on-state of the FET is held until the gate-to-source voltage goes below the threshold value. Therefore, during on of the FET 3, the counter electromotive force on the load 1 is absorbed by the power supplied through the FET 3.

FIG. 7 is a figure showing the manner of a surge current, etc., during powering off the load 1, in the circuit arrangement of FIG. 6. In FIG. 7, the graph G1 represents a change in time of a current $I_L$ (see FIG. 6) flowing through the load 1 during powering off the load 1, in the circuit arrangement of FIG. 6 while the graph G2 represents a change in time of a source voltage $V_s$ (see FIG. 6) of the FET 3 during powering off the load 1, also in the circuit arrangement of FIG. 6. Meanwhile, the graph G3 of FIG. 7 represents a change in time of a source voltage $V_s$ during powering off the load 1 when the Zener diode 5 is removed, in the circuit arrangement of FIG. 6.

SUMMARY OF THE INVENTION

However, the conventional protection circuit involves a problem that the circuit arrangement is increased in size and cost because of using the Zener diode 5. Furthermore, there is also a problem that radio-frequency noise occurs when turning on/off the Zener diode.

Therefore, it is an object of the present invention to provide, while achieving to reduce the size and cost of circuit arrangement, a protection circuit that countermeasure can be taken to the surge voltage during powering off the load in a circuit arrangement the invention is applied wherein there is no need to use an element, such as a Zener diode, that causes radio-frequency noise.

According to the first aspect of the invention, there is provided a protection circuit to be provided for a circuit arrangement having an inductive load and an FET as an N-channel MOS transistor provided upstream of the load with respect to a flow of power current, the FET controlling an energization state of the load, the protection circuit including a first connection changer interposed on a connection line between a gate of the FET and a gate drive voltage supply source, the first connection changer changing a connection state between a first connection state in which the gate is connected to the gate drive voltage supply and a second connection state in which the gate is connected to a ground.

According to the second aspect of the invention, there is provided a protection circuit to be provided for a circuit arrangement having an inductive load and an FET as an N-channel MOS transistor provided upstream of the load with respect to a flow of power current, the FET controlling an energization state of the load, the protection circuit including a first connection changer interposed between a portion on a first connection line and a ground, the first connection changer connecting and disconnecting between the portion and the ground. Preferably, the first connection line connects a gate of the FET and a gate drive voltage supply source.

According to the third aspect of the invention, there is provided a protection circuit to be provided for a circuit arrangement having an inductive load and an FET as a P-channel MOS transistor, the FET for controlling an energization state of the load, the protection circuit including a connection changer interposed on a connection line between a gate of the FET and a ground, the connection changer changing a connection state between a first connection state in which the gate is connected to the ground and a second connection state in which the gate is connected to a source of the FET, a first resistor interposed between the gate of the FET and the connection changer or between the connection changer and the source of the FET, and a second resistor interposed between the gate and the drain of the FET.

According to the fourth aspect of the invention, there is provided a protection circuit to be provided for a circuit arrangement having an inductive load and an FET as a F-channel MOS transistor, the FET controlling an energization state of the load, the protection circuit including a connection changer interposed between a portion, on a connection line between a gate and a source of the FET, and a ground, the connection changer connecting and disconnecting between the portion and the ground, a first resistor interposed on a route of from the gate of the FET to the source thereof through the connection line, and a second resistor interposed between the gate and a drain of the FET.

According to the fifth aspect of the invention, there is provided a protection circuit to be provided for a circuit arrangement having an inductive load and an IGBT provided upstream of the load with respect to a flow of power current, the IGBT controlling an energization state of the load, the protection circuit including a connection changer interposed on a connection line between a gate of the IGBT and a gate drive voltage supply source, the connection changer changing a connection state between a first connection state in which the gate is connected to the gate drive voltage supply and a second connection state in which the gate is connected to a ground.

According to the sixth aspect of the invention, there is provided a protection circuit to be provided for a circuit arrangement having an inductive load and an IGBT provided upstream of the load with respect to a flow of power current, the IGBT controlling an energization state of the load, the protection circuit including a connection changer interposed between a portion on a connection line and a ground, the connection changer connecting and disconnecting between the portion and the ground. Preferably, the connection line connects a gate of the IGBT and a gate drive voltage supply source.

BRIEF DESCRIPTION OF THE DRAWINGS

The present invention may be more readily described with reference to the accompanying drawings:

FIG. 6 is a circuit diagram of a protection circuit and a circuit arrangement the protection circuit is applied, in the conventional; and FIG. 7 is a figure showing a manner of a surge current, etc., during powering off a load in the FIG. 6 circuit arrangement.

DETAILED DESCRIPTION OF THE PREFERRED EMBODIMENTS

Figure 1:
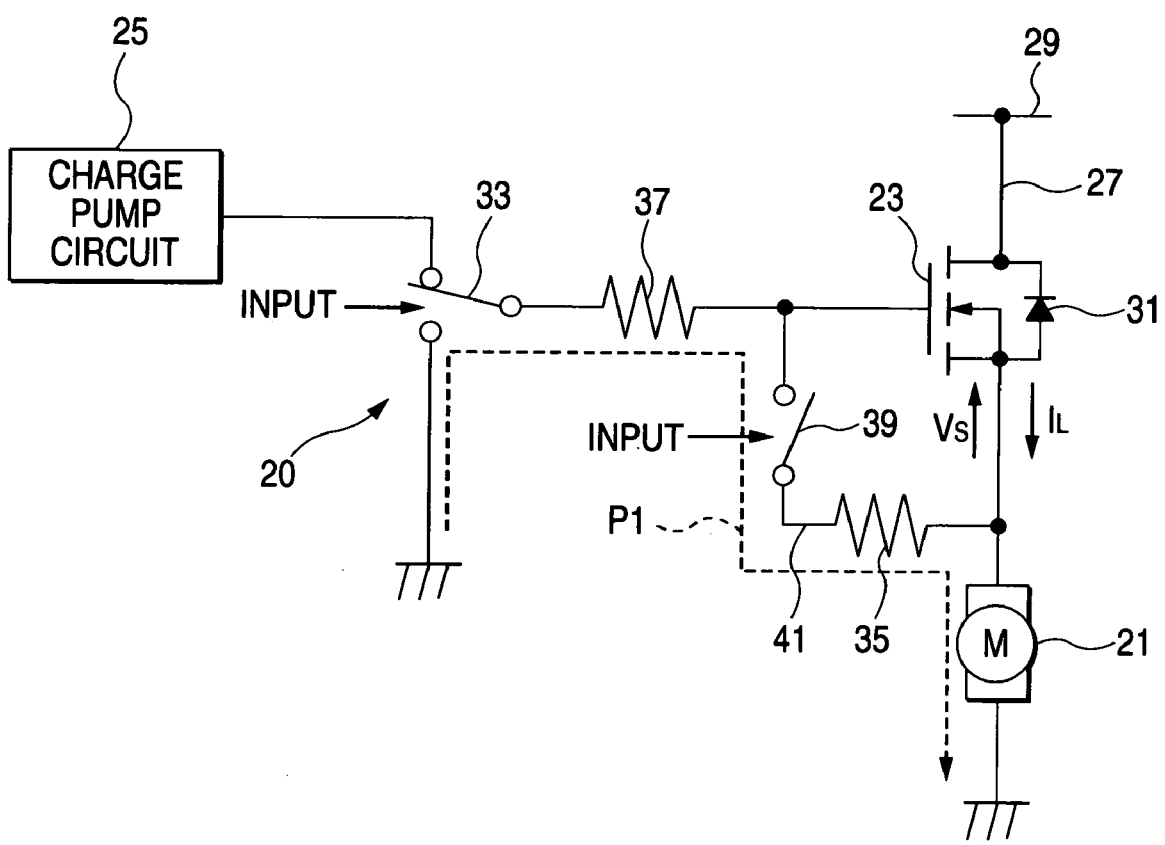
FIG. 1 is a circuit diagram of a protection circuit and a circuit arrangement the protection circuit is applied, according to a first embodiment of the present intention.

FIG. 1 is a circuit diagram of a protection circuit and circuit arrangement the protection circuit 20 is applied, according to a first embodiment of the present invention. The circuit arrangement, a protection circuit 20 of this embodiment is applied, has an inductive load (e.g. motor) 21, an FET 23 as an N-channel MOS transistor for taking control of the energization state to the load 21, and a charge pump circuit (gate drive voltage supply source) for driving the FET 23, as shown in FIG. 1. The load 21 and the FET 23 are interposed in series on a conductor line 27 such that the FET 23 is positioned upstream with respect to the direction of power current flow. The conductor line 27 is interposed between the power line 29 and the ground. On the conductor line 27, a diode 31 is connected in series with the FET 23. The diode 31 is connected forward, reverse in direction to the power current flow supplied from the power line 29 to the energization line 27.

The protection circuit 20 of this embodiment has a first switch (first connection changer) interposed on a connection line between a gate of the FET 23 and a charge pump circuit 25, a first resistor 35 interposed between the gate and the source of the FET 23, a second resistor 37 interposed between the gate of the FET 23 and the first switch 33, and a second switch (second connection changer) 39 interposed on a connection line 41 between the gate and the source of the FET 23 where the first resistor 35 is interposed. The first and second switches 33, 39 switch the circuit according to an input control signal. The second resistor 37 may be interposed between the first switch 33 and the ground, instead of between the FET 23 gate and the first switch 33.

The first switch 33 is connected with a connection line leading to the charge pump circuit 25 and a connection line leading to the ground, as viewed from the first switch 33. The both connection lines are to be selectively switched over by the first switch 33 into connection to the gate of the FET 23.

The first switch 33 serves also as an on-off switch for the FET 23. When the FET 23 is turned on to drive the load 21, the first switch 33 connects the FET 23 gate to the charge pump circuit 25 (first connection state). Meanwhile, when the FET 23 is turned off to power off the load 21, the first switch 33 connects the FET 23 gate to the ground (second connection state).

The second switch 39 is to prevent the gate drive signal outputted from the charge pump circuit 25 from leaking toward the load 21 through the first switch 33 and resistors 35, 37. When the first switch 33 is switched on the charge pump circuit 25, the second switch 39 disconnects the connection line 41 between the gate and the source of the FET 23 where the first resistor 35 is interposed. Meanwhile, when the first switch 33 is switched on the ground side, the second switch 39 puts the connection line 41 in connection.

Explanation is now made on the operation of the circuit arrangement of FIG. 1. During driving the load 21, the first switch 33 is switched on the side of charge pump circuit 25. The gate drive signal outputted from the charge pump circuit 15 is supplied to the FET 23 gate through the first switch 33 and second resistor 37. This allows the power current on the power line 29 to flow to the load 21 through the FET 23, thus driving the load 21. At this time, the second switch 39 puts the connection line 41 in disconnection.

When powering off the load 21, the first switch 33 is switched from the charge pump circuit 25 over to the ground while the second switch 39 puts the connection line in connection. The gate-to-source voltage of FET 23 goes lower than a threshold voltage, to turn off the FET 23 and terminate the energization to the load 21. Due to the turning off of the FET 23, a negative surge is caused by an inductive counter electromotive force on the load 21. This pulls the source voltage of FET 23 toward the minus, to flow a current from the ground toward the load 21 through the first switch 33, second resistor 37, second switch 39 and first resistor 35, as shown by the route P1. At this time, the FET 23 has, between the gate and source, a potential difference of divisional voltage caused in a magnitude commensurate with a source voltage level and a ratio in resistor value of the first and second resistors 35, 37. At a time the gate-to-source voltage exceeds the threshold voltage, the FET 23 turns on. The on-state of FET 23 is held until the gate-to-source voltage goes below the threshold value. Due to this, during on of the FET 23, the counter electromotive force on the load 21 is absorbed by the power to be supplied from the power line 29 to the load 21 through the FET 23. Meanwhile, the on-state of FET 23 terminates as the negative surge on the load 21 converges and the gate-to-source voltage goes below the threshold value.

Figure 2:
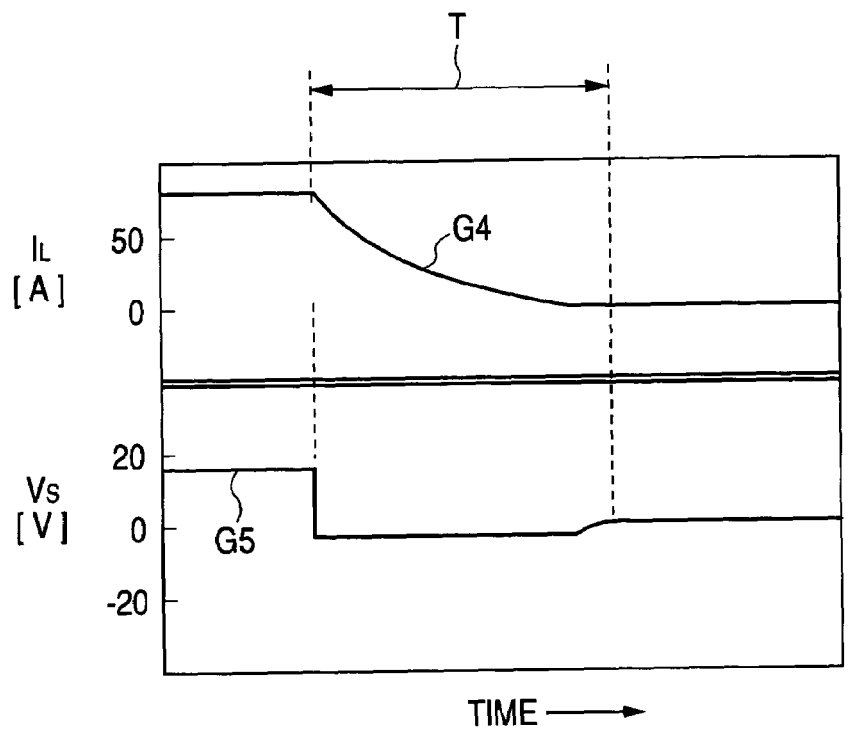
FIG. 2 is a figure showing a manner of a surge current, etc., during powering off a load in the FIG. 1 circuit arrangement.

FIG. 2 is a figure showing the manner of surge current, etc., during powering off the load 21, in the circuit configuration of FIG. 1. The graph G4 in FIG. 2 shows a change in time of a current $I_L$ (see FIG. 1) flowing through the load 21 during powering off the load 21 in the circuit arrangement of FIG. 1. The graph G5 shows a change in time of a source voltage $V_s$ on the FET 23 during powering off the load 21, similarly in the circuit arrangement of FIG. 1. It can be seen from the graph G4, G5 that the protection circuit 20 in this embodiment provides the surge suppression effect nearly equivalent to that of the foregoing protection circuit of FIG. 6.

Herein, in the protection circuit 20 of this embodiment, by adjusting the ratio in resistor value of the first resistor 35 and second resistor 37, it is possible to adjust the gate-to-source voltage of FET 23 caused upon flowing of a current from the ground toward the load 21 through the first and second resistors 35, 37 during occurrence of a negative surge. Due to this, it can be easily adjusted when to turn on the FET 23 in what degree the FET 23 source voltage is pulled minus at the occurrence of a negative surge. Furthermore, during occurrence of negative surge, a sufficient level of gate-to-source voltage can be secured (e.g. this can completely turn on the FET 23) at the occurrence of a negative surge. As a result, it is possible to reduce the time T required to absorb negative surge (see FIG. 2).

Figure 3:
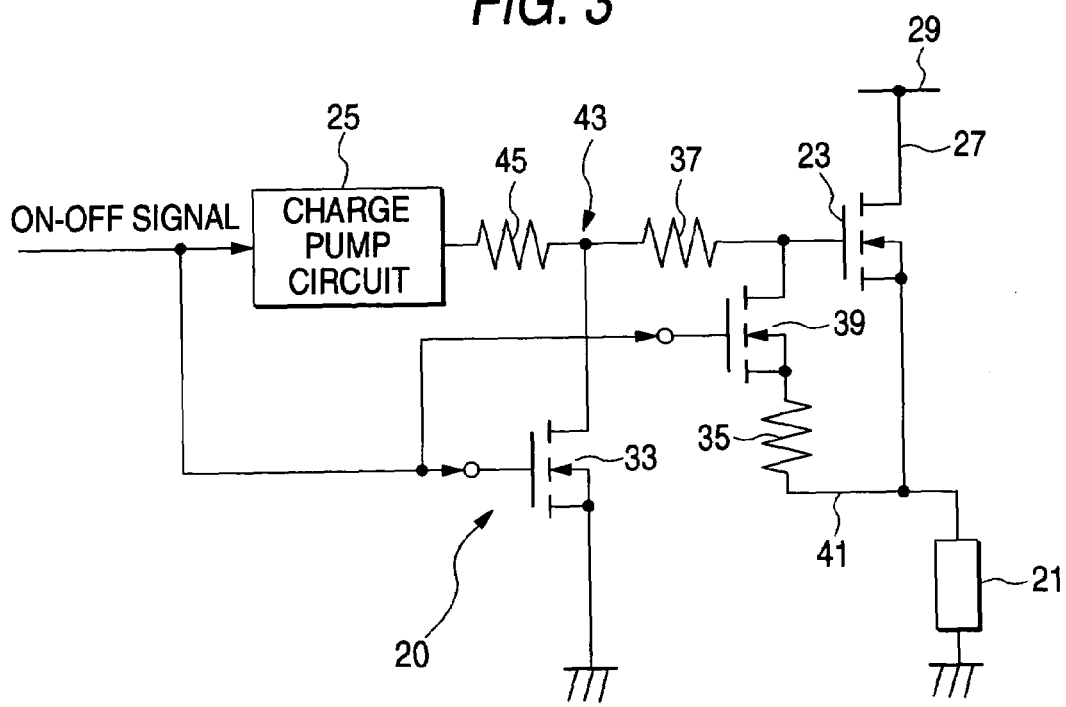
FIG. 3 is a diagram showing a circuit further detailed of the protection circuit included in the FIG. 1 circuit arrangement.

FIG. 3 is a diagram showing a circuit derailed greater of the protection circuit 20 included in the FIG. 1 circuit arrangement. In FIG. 3 embodiment, N-channel MOS FETs are used as first and second switches 33, 39, as shown in FIG. 3. Also, in this concrete embodiment, the first switch (FET) 33 is interposed between a point 43, between a second resistor 37 and a charge pump circuit 25 on a connection line extending between the FET 23 gate and the charge pump circuit 25, and a ground. The first switch 33 connects and disconnects between the point 43 and the ground, depending upon an input on-off signal. The second switch (FET) 39 similarly connects and disconnects the connection line 41, depending upon the input on-off signal. In this embodiment, the signals for turning on/off the first and second switches 33, 39 and charge pump circuit 25 employ the common on-off signal. Incidentally, in this embodiment, a third resistor 45 is interposed on the connection line extending between the FET 23 gate and the charge pump circuit 25, between the point 43 (point connecting the first switch 33) and the charge pump 25.

As described above, according to the preset embodiment, a protection circuit 20 can be configured by a simple circuit arrangement using first and second switches 33, 39 and the first and second resistors 35, 37. As a result, while reducing the size and cost of circuit arrangement, countermeasure can be taken to the surge voltage during powering off the load 21 in the circuit arrangement applied with the present embodiment. Moreover, there is no need to use such an element of a Zener diode or the like that possibly generates radio-frequency noise.

Meanwhile, by adjusting the ratio in resistor value of the first resistor 35 and second resistor 37 as in the above, obtained is an effect to reduce the time T required in absorbing a negative surge or the like.

Furthermore, when the first switch 33 is switched on the charge pump circuit 25 to thereby drive the load 21, the second switch 39 disconnects the connection line 41 extending between the gate and the source of the FET 23 where the first resistor 35 is interposed. Accordingly, it is possible to prevent the gate drive signal outputted from the charge pump circuit 25 from leaking toward the load 21 through the connection line 41.

Figure 4:
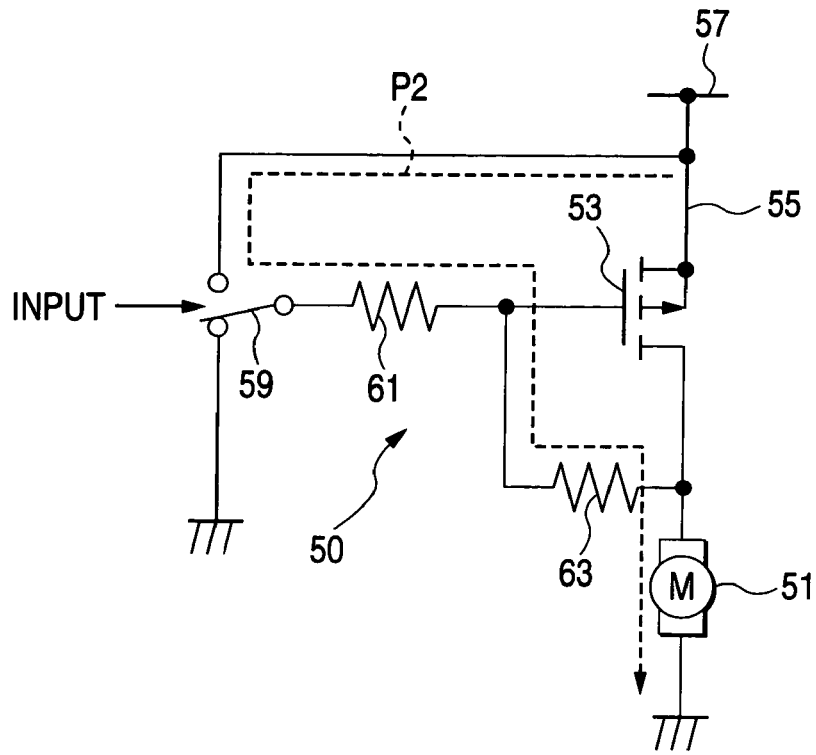
FIG. 4 is a circuit diagram of a protection circuit and a circuit arrangement the protection circuit is applied, according to a second embodiment of the present invention.

FIG. 4 is a circuit diagram of a protection circuit and circuit arrangement the protection circuit 50 is applied, according to a second embodiment of the present invention. The circuit arrangement, the protection circuit 50 of this embodiment is applied, has an inductive load (e.g. motor) 51, and an FET 53 as a P-channel MOS transistor for taking control of the energization state to the load 51, as shown in FIG. 4. In this embodiment, the load 51 and the FET 53 are interposed in series on a conductor line 55 such that the FET 53 is located upstream with respect to the direction of power current flow. However, the arrangement maybe such that the load 51 is upstream with respect to the direction of current flow. The conductor line 55 is interposed between the power line 57 and the ground.

The protection circuit 50 of this embodiment has a switch (connection changer) 59 interposed on the connection line between the gate of FET 53 and the ground, a first resistor 61 interposed between the gate of FET 53 and a switch 59, and a second resistor 63 interposed between the gate and the drain of the FET 53. The switch 59 switches the circuit depending upon an input control signal. The first resistor 61 may be interposed between the switch 59 and the source of FET 53, instead of between the gate of FET 53 and the switch 59.

The switch 59 is connected with a connection line leading to the ground and a connection line leading to the source of FET 53, as viewed from the switch 59. The both connection lines can be selectively switched by the switch 59 into connection to the gate of the FET 53.

The switch 59 serves also as an on-off switch for the FET 53. When the FET 53 is turned on to drive the load 51, the switch 59 connects the gate of FET 53 to the ground (first connection state). Meanwhile, when the FET 53 is turned off to power off the load 51, the switch 59 connects the gate of FET 53 to the source of FET 53 (second connection state).

Explanation is now made on the operation of the circuit arrangement of FIG. 4. During driving the load 51, the switch 59 is switched on the ground. The gate of FET 53 is connected to the ground through the first resistor 61 and switch 59. Due to this, the gate-to-source voltage of FET 53 exceeds a threshold voltage, to turn on the FET 53. The power current on the power line 57 flows to the load 51 through the FET 53, thereby driving the load 51.

During powering off the load 51, the switch 59 is switched from the ground over to the source of FET 53. The gate-to-source voltage of FET 53 goes lower than a threshold voltage (once zero substantially), to turn off the FET 53 and terminate the energization to the load 51. Due to turning off of the FET 53, a negative surge is caused by an inductive counter electromotive force on the load 51. This pulls the gate voltage of FET 53 toward the minus, to flow a current from the source of FET 53 toward the load 51 through the switch 59, the first resistor 61 and the second resistor 63, as shown by the route P2. At this time, the FET 53 at its gate and source has a potential difference of divisional voltage caused in a magnitude commensurate with a source-to-drain potential difference level and a ratio in resistor value of the first and second resistors 61, 63. At a time that the gate-to-source voltage exceeds the threshold voltage, the FET 53 turns on. The on-state of FET 53 is held until the gate-to-source voltage goes below the threshold value. Due to this, during on of the FET 53, the counter electromotive force on the load 51 is absorbed by the power to be supplied from the power line 57 to the load 51 through the FET 53. Meanwhile, the on-state of FET 53 terminates as the negative surge by the load 21 converges and the gate-to-source voltage goes below the threshold value.

Herein, in the protection circuit 50 of this embodiment, by adjusting the ratio in resistor value of the first resistor 61 and second resistor 63, it is possible to adjust the gate-to-source voltage of FET 53 caused upon flowing of a current from the source of FET 53 toward the load 51 through the first and second resistors 61, 63 during occurrence of a negative surge. Due to this, it can be easily adjusted whether to turn on the FET 53 in what degree the FET 53 source voltage is pulled minus at the occurrence of a negative surge. Furthermore, when turning on the FET 53 during occurrence of a negative surge, a sufficient level of gate-to-source voltage can be secured (e.g. this can completely turn on the FET 53. As a result, it is possible to reduce the time T required in absorbing a negative surge.

As in the above, according to the present embodiment, a protection circuit 50 can be configured by a simple circuit arrangement using a switch 59 and first and second resistors 61, 63. Accordingly, while reducing the size and cost of circuit arrangement, countermeasure can be taken to a surge voltage upon powering off the load 61 in the circuit arrangement applied with the present embodiment. Moreover, there is no need to use such an element of a Zener diode or the like that possibly generates radio-frequency noise.

Also, as in the above, by adjusting the ratio in resistor value of the first resistor 61 and second resistor 62, obtained is an effect to reduce the time required in absorbing negative surge or the like.

Incidentally, the detailed embodiment of circuit arrangement may employ the FIG. 3 FET 33 as a switch 59.

Figure 5:
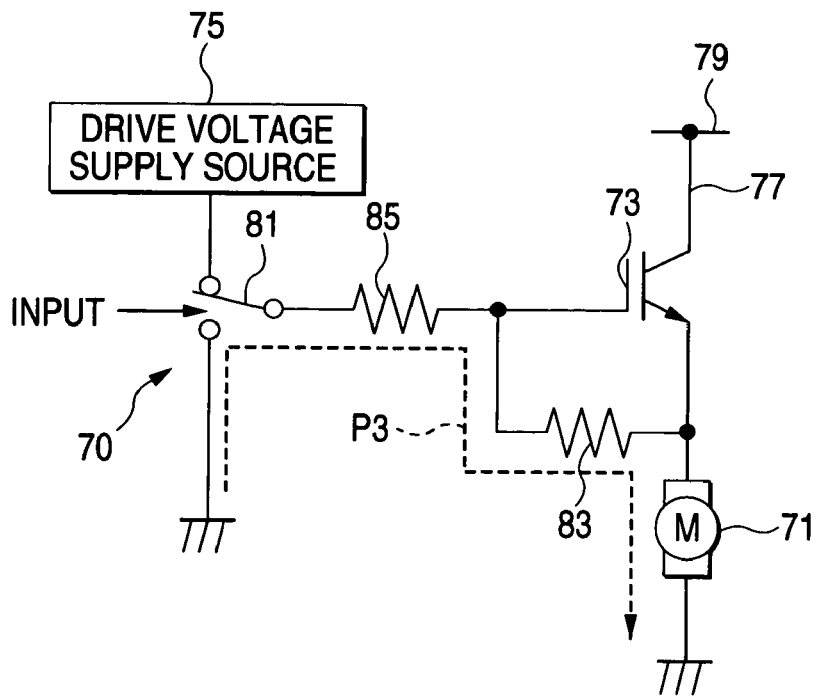
FIG. 5 is a circuit diagram of a protection circuit and a circuit arrangement the protection circuit is applied, according to a third embodiment of the present invention.

FIG. 5 is a circuit diagram of a protection circuit and circuit arrangement the protection circuit is applied, according to a third embodiment of the present invention. The circuit arrangement, the protection circuit 70 of this embodiment is applied, has an inductive load (e.g. motor) 71, an IGBT 73 for taking control of the energization state to the load 71, and a gate-drive voltage supply source (e.g. drive circuit) for supplying a gate drive voltage for driving the IGBT 73, as shown in FIG. 5. The load 71 and the IGBT 73 are interposed in series on a conductor line 77 such that the IGBT 73 is located upstream with respect to the direction of power current flow. The conductor line 77 is interposed between the power line 79 and the ground.

The protection circuit 70 of this embodiment has a switch (connection changer) 81 interposed on the connection line between the gate of IGBT 73 and the gate-drive voltage supply source 75, a first resistor 83 interposed between the gate and the emitter of IGBT 73, and a second resistor 85 interposed between the gate of IGBT 73 and the switch 81. The switch 81 switches the circuit depending upon an input control signal. The second resistor 85 may be interposed between the switch 81 and the ground, instead of between the gate of IGBT 73 gate and the switch 81.

The switch 81 is connected with a connection line leading to the gate-drive voltage supply source 75 and a connection line leading to the ground, as viewed from the switch 81. The both connection lines can be selectively switched by the switch 81 into connection to the gate of the IGBT 73.

The switch 81 serves also as an on-off switch for the IGBT 73. When the IGBT 73 is turned on to drive the load 71, the switch 81 connects the gate of IGBT 73 to the gate-drive voltage supply source 75 (first connection state). Meanwhile, when the IGBT 73 is turned off to power off the load 21, the switch 81 connects the gate of IGBT 73 to the ground (second connection state).

Explanation is now made on the operation of the circuit arrangement of FIG. 5. During driving the load 71, the switch 81 is switched on a side of gate-drive voltage supply source 75. The gate drive voltage outputted from the gate-drive voltage supply source 75 is supplied to the gate of IGBT 73 through the switch 81 and second resistor 85. Due to this, the gate-to-emitter voltage of IGBT 73 exceeds a threshold voltage, to turn on the IGBT 73. The power current on the power line 79 flows to the load 71 through the IGBT 73, thereby driving the load 71.

During powering off the load 71, the switch 81 is switched from the gate-drive voltage supply source 75 over to the ground. The gate of the IGBT 73 is connected to the ground through the second resistor 82 and switch 81, and the gate-to-emitter voltage of IGBT 73 goes lower than a threshold voltage, to turn off the IGBT 73 and terminate the energization to the load 71. Due to turning off of the IGBT 73, a negative surge is caused by an inductive counter electromotive force on the load 71. This pulls the emitter voltage of IGBT 73 toward the minus. As shown by the route P3, a current flows from the ground toward the load 71 through the switch 81 and first and second resistors 83, 85. At this time, the IGBT 73 at its gate and emitter has a potential difference of divisional voltage caused in a magnitude commensurate with an emitter potential level and a resistor value ratio of first and second resistors 83, 85. At a time that the gate-to-emitter voltage exceeds the threshold voltage, the IGBT 73 turns on. The on-state of IGBT 73 is held until the gate-to-emitter voltage goes below the threshold value. Due to this, during on of the IGBT 73, the counter electromotive force on the load 71 is absorbed by the power to be supplied from the power line 79 to the load 71 through the IGBT 73. Meanwhile, the on-state of IGBT 73 terminates as the negative surge by the load 71 converges and the gate-to-emitter voltage goes below the threshold value.

Herein, in the protection circuit 70 of this embodiment, by adjusting the ratio in resistor value of the first resistor 83 and second resistor 85, it is possible to adjust the gate-to-emitter voltage of IGBT 73 caused upon flowing of a current from the ground toward the load 71 through the first and second resistors 83, 85 during occurrence of a negative surge. Due to this, it can be easily adjusted when to turn on the IGBT 73 in what degree the IGBT 73 emitter voltage is pulled minus during the occurrence of a negative surge. Furthermore, when turning on the IGBT 73 during the occurrence of a negative surge, a sufficient level of gate-to-emitter voltage can be secured (e.g. this can completely turn on the IGBT 73). As a result, it is possible to reduce the time required for absorbing negative surge.

As described above, according to the preset embodiment, a protection circuit 70 can be configured by a simple circuit arrangement using a switch 81 and first and second resistors 83, 85. Accordingly, while reducing the size and cost of circuit arrangement, countermeasure can be taken to the surge voltage during powering off the load 71 in the circuit arrangement applied with the present embodiment. Moreover, there is no need to use such an element of a Zener diode or the like that possibly generates radio-frequency noise.

Also, as described above, by adjusting the ratio in resistor value of the first resistor 83 and second resistor 85, obtained is an effect to reduce the time required for absorbing negative surge or so.

Incidentally, the detailed embodiment of circuit arrangement may use the FET 33 of FIG. 3 as the switch 81.

According to an aspect of the invention, during powering off the load, the first connection changer is changed from a first connection state the gate of an FET is connected to a gate drive voltage supply source to a second connection state the gate is connected to the ground. By a negative surge caused due to powering off the load, the gate-to-source voltage of FET exceeds a threshold and the FET turns from off to on whereby a negative surge can be absorbed by a current flowing to the load through the FET. Accordingly, a protection circuit can be configured by a simple circuit arrangement. As a result, while reducing the size and cost of circuit arrangement, countermeasure can be taken to the surge voltage during powering off the load in the circuit arrangement applied with the present embodiment. Moreover, there is no need to use such an element of a Zener diode or the like that possibly generates radio-frequency noise.

According to another aspect of the invention, by adjusting the ratio in resistor value of the first resistor and second resistor, it is possible to adjust the FET gate-to-source voltage caused upon flowing of a current from the ground to the FET source through the first and second resistors at the occurrence of a negative surge. Due to this, it is possible to easily adjust whether to turn on the FET in what degree the FET source voltage is pulled toward the minus upon occurrence of a negative surge occurrence. Furthermore, a sufficient level of gate-to-source voltage can be obtained in turning on the FET upon occurrence of a surge (e.g. this can turn on the FET completely). As a result, it is possible to reduce the time required in absorbing the surge.

According to another aspect of the invention, the first connection changer is placed in a first connection state the FET gate is connected to the gate drive voltage supply source, to turn on the FET. In the case the load is being driven, the second switch disconnects the connection line between the gate and the source of the FET, thereby making it possible to prevent the gate drive signal outputted from the gate drive voltage supply source from leaking toward the load through the first resistor.

According to yet another aspect of the invention, during powering off the load, the connection changer is changed from a first connection state the gate of FET is connected to the ground to a second connection state the gate is connected to the source. Due to this, the gate-to-source voltage of FET, caused by a current flow from the FET source to the drain through the connection changer and first and second resistors, exceeds a threshold due to a surge occurrence by powering off the load, thereby turning the FET from off to on whereby a surge can be absorbed by a current flow to the load. Accordingly, a protection circuit can be configured by a simple circuit arrangement. As a result, while reducing the size and cost of circuit arrangement, countermeasure can be taken to the surge voltage during powering off the load in the circuit arrangement applied with the present embodiment. Moreover, there is no need to use such an element of a Zener diode or the like that possibly generates radio-frequency noise.

Also, by adjusting the ratio in resistor value of the first resistor and second resistor, it is possible to adjust the FET gate-to-source voltage caused upon flowing of a current from the FET source to the ground through the first and second resistors upon occurrence of a surge. Due to this, it is possible to easily adjust whether to turn on the FET in what magnitude a surge is caused. Furthermore, a sufficient level of gate-to-source voltage can be obtained in turning on the FET upon occurrence of a surge (e.g. this can turn on the FET completely). As a result, it is possible to reduce the time required for absorbing the surge.

According to still another aspect of the invention, during powering off the load, the connection changer is changed from a first connection state the gate of IGBT is connected to a gate drive voltage supply source to the second connection state the gate is connected to a ground. The gate-to-emitter voltage of IGBT exceeds a threshold due to the occurrence of a negative surge by powering off the load, thereby turning the IGBT from off to on whereby a negative surge can be absorbed by a current flow to the load through the IGBT. Accordingly, a protection circuit can be configured by a simple circuit arrangement. As a result, while reducing the size and cost of circuit arrangement, countermeasure can be taken to the surge voltage during powering off the load in the circuit arrangement applied with the present embodiment. Moreover, there is no need to use such an element of a Zener diode, or the like that possibly generates radio-frequency noise.

According to yet another aspect of the invention, by adjusting the ratio in resistor value of the first resistor and second resistor, it is possible to adjust the IGBT gate-to-emitter voltage caused upon flowing of a current from the ground to the IGBT emitter through the first and second resistors upon occurrence of a negative surge. Due to this, it is possible to easily adjust whether to turn on the FET in what degree the IGBT emitter voltage is pulled toward the minus upon occurrence of a negative surge. Furthermore, a sufficient level of gate-to-emitter voltage can be obtained in turning on the IGBT upon occurrence of a negative surge (e.g. this can turn on the IGBT completely). As a result, it is possible to reduce the time required in absorbing the negative surge.

What is claimed is:

1. A protection circuit, to be provided for a circuit arrangement having an inductive load and an FET as an N-channel MOS transistor provided upstream of the load with respect to a flow of power current, the FET controlling an energization state of the load, the protection circuit comprising:
    a first connection changer interposed on a connection line between a gate of the FET and a gate drive voltage supply source, the first connection changer changing a connection state between a first connection state in which the gate is connected to the gate drive voltage supply and a second connection state in which the gate is connected to a ground; and
    a first resistor interposed between the gate and a source of the FET,
    wherein the protection circuit does not include a zener diode, and protects from overvoltage generated by the load upon discontinuing power to the load.

2. The protection circuit according to claim 1, further comprising:
    a second resistor interposed between the gate and the first connection changer or between the first connection changer and the ground.

3. The protection circuit according to claim 2, further comprising:
    a second connection changer interposed on a connection line between the gate and the source of the FET, the second connection changer for connecting and disconnecting the connection line;
    wherein the first resistor is interposed on the connection line.

4. A protection circuit, to be provided for a circuit arrangement having an inductive load and an FET as an N-channel MOS transistor provided upstream of the load with respect to a flow of power current, the FET controlling an energization state of the load, the protection circuit comprising:
  a first connection changer interposed between a portion on a first connection line and a ground, the first connection changer connecting and disconnecting between the portion and the ground; and
  a first resistor interposed on a second connection line between the gate and a source of the FET, wherein the first connection line connects a gate of the FET and a gate drive voltage supply source, and
  wherein the protection circuit does not include a zener diode, and protects from overvoltage generated by the load upon discontinuing power to the load.

5. The protection circuit according to claim 4, further comprising:
  a second resistor interposed on a route from the gate to the ground through the first connection line and the connection changer.

6. The protection circuit according to claim 5, further comprising:
  a second connection changer interposed on the second connection line between the gate and the source of the FET, the second connection changer connecting and disconnecting the second connection line;
  wherein the first resistor is interposed in the second connection line.

7. A protection circuit, to be provided for a circuit arrangement having an inductive load and an IGBT provided upstream of the load with respect to a flow of power current, the IGBT controlling an energization state of the load, the protection circuit comprising:
  a connection changer interposed on a connection line between a gate of the IGBT and a gate drive voltage supply source, the connection changer changing a connection state between a first connection state in which the gate is connected to the gate drive voltage supply and a second connection state in which the gate is connected to a ground; and
  a first resistor interposed between the gate and an emitter of the IGBT,
  wherein the protection circuit does not include a zener diode, and protects from overvoltage generated by the load upon discontinuing power to the load.

8. The protection circuit according to claim 7, further comprising:
  a second resistor interposed between the gate of the IGBT and the connection changer or between the connection changer and the ground.

9. A protection circuit, to be provided for a circuit arrangement having an inductive load and an IGBT provided upstream of the load with respect to a flow of power current, the IGBT controlling an energization state of the load, the protection circuit comprising:
  a connection changer interposed between a portion on a connection line and a ground, the connection changer connecting and disconnecting between the portion and the ground; and
  a first resistor interposed between the gate and an emitter of the IGBT;
  wherein the connection line connects a gate of the IGBT and a gate drive voltage supply source, and
  wherein the protection circuit does not include a zener diode, and protects from overvoltage generated by the load upon discontinuing power to the load.

10. The protection circuit according to claim 9, further comprising:
  a second resistor interposed on a route from the gate of the IGBT to the ground through the connection line and the connection changer.

* * * * *